United States Patent
Son

(10) Patent No.: US 11,856,717 B2
(45) Date of Patent: Dec. 26, 2023

(54) DISPLAY APPARATUS

(71) Applicant: LG Display Co., Ltd., Seoul (KR)

(72) Inventor: Sungsik Son, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/864,009

(22) Filed: Jul. 13, 2022

(65) Prior Publication Data

US 2023/0014313 A1    Jan. 19, 2023

(30) Foreign Application Priority Data

Jul. 16, 2021   (KR) .......................... 10-2021-0093240

(51) Int. Cl.
*H05K 5/00* (2006.01)
*H05K 5/03* (2006.01)

(52) U.S. Cl.
CPC ......... *H05K 5/0026* (2013.01); *H05K 5/0018* (2022.08); *H05K 5/03* (2013.01)

(58) Field of Classification Search
CPC .. H05K 5/03; H05K 5/0018; G06F 1/133308; G02F 2201/46; G02F 1/133317; G02F 1/133308

See application file for complete search history.

(56) References Cited

U.S. PATENT DOCUMENTS

| | | | |
|---|---|---|---|
| 5,018,982 A * | 5/1991 | Speraw | H05K 7/142 439/74 |
| 6,262,887 B1 * | 7/2001 | Lee | G06F 1/1616 361/752 |
| 7,983,057 B2 * | 7/2011 | Zheng | H05K 7/142 361/752 |
| 8,174,839 B2 | 5/2012 | Kim et al. | |
| 9,210,823 B2 * | 12/2015 | Sawada | H04M 1/0277 |
| 2002/0181219 A1 * | 12/2002 | Paquin | H05K 7/142 361/809 |
| 2006/0044745 A1 * | 3/2006 | Kim | G06F 1/1601 361/679.22 |
| 2006/0114662 A1 * | 6/2006 | Liu | H05K 7/142 361/759 |
| 2006/0192730 A1 * | 8/2006 | Kim | H05K 5/02 345/60 |

(Continued)

FOREIGN PATENT DOCUMENTS

| | | |
|---|---|---|
| KR | 10-2010-0079700 A | 7/2010 |
| KR | 10-2011-0000916 A | 6/2011 |

*Primary Examiner* — Sagar Shrestha
(74) *Attorney, Agent, or Firm* — Seed IP Law Group LLP

(57) ABSTRACT

A display apparatus includes a display, a cover coupled to the display and providing therein a space for accommodating parts, a plurality of printed circuit boards accommodated in the cover, and a mounting portion coupled to the display, accommodated in the cover, and having a first mounting protrusion formed thereon, wherein the printed circuit boards are mounted on the first mounting protrusion, wherein the first mounting protrusion includes a plurality of mounting grooves, wherein the printed circuit boards are mounted in the plurality of mounting grooves, wherein the plurality of mounting grooves are defined at positions spaced apart from each other in a length direction of the first mounting protrusion such that the plurality of the printed circuit boards are disposed to be spaced apart from each other.

15 Claims, 11 Drawing Sheets

(56) References Cited

U.S. PATENT DOCUMENTS

| | | | | |
|---|---|---|---|---|
| 2008/0238826 | A1* | 10/2008 | Kang | ........................ H05K 5/02 |
| | | | | 345/64 |
| 2017/0164487 | A1* | 6/2017 | Kim | ........................ G06F 1/184 |
| 2019/0129235 | A1* | 5/2019 | Yamamoto | ........ G02F 1/133308 |
| 2021/0382336 | A1* | 12/2021 | Lee | ................... G02F 1/133314 |
| 2022/0400551 | A1* | 12/2022 | Wang | ..................... H05K 7/023 |

\* cited by examiner

DISPLAY APPARATUS

CROSS-REFERENCE TO RELATED APPLICATION

This application claims priority to and the benefit of Korean Patent Application No. 10-2021-0093240, filed on Jul. 16, 2021, which is hereby incorporated by reference as if fully set forth herein.

BACKGROUND

Technical Field

The present disclosure relates to a display apparatus, and more particularly, to a display apparatus having a structure with improved space efficiency.

Description of the Related Art

Contents described in this Background section simply provide background information about the present disclosure and do not constitute the prior art.

As we enter a full-fledged information era, a display apparatus that visually expresses an electrical information signal has developed rapidly. In response thereto, various display apparatuses having excellent performance, thinness, light weight, and low power consumption have been developed.

The display apparatuses include a liquid crystal display apparatus (LCD), a quantum dot (QD) display apparatus, a field emission display apparatus (FED), an electro-wetting display apparatus (EWD), and an organic light-emitting display apparatus (OLED), etc.

The display apparatus may be formed in a shape in which a display for displaying an image, at least one printed circuit board for controlling an operation of the image reproduced on such display and supplying electricity, and a cover for accommodating the printed circuit board therein are coupled to each other.

BRIEF SUMMARY

A display may be manufactured in a relatively small size for miniaturization of an apparatus. Correspondingly, an area of a cover may correspond to an area of the display.

However, a printed circuit board is limited in size considering sizes and the numbers of various elements and a mounting space, so that there is a limit in manufacturing the printed circuit board to have a size smaller than an accommodation area of the cover.

Further, when a plurality of printed circuit boards are mounted in one display apparatus, a total area occupied by the plurality of printed circuit boards may be larger than the accommodation area of the cover. In this case, it is necessary to accommodate the printed circuit board in the cover by reducing the area of the printed circuit board, but, as described above, there is a problem that the size of the printed circuit board is not able to be easily reduced.

Accordingly, an embodiment of the present disclosure is to provide a display apparatus having a structure that may efficiently accommodate the printed circuit board therein.

In addition, an embodiment of the present disclosure is to provide a display apparatus having a structure in which the cover may accommodate all of the plurality of printed circuit boards even when the total area of the plurality of printed circuit boards exceeds the accommodation area of the cover.

In addition, an embodiment of the present disclosure is to provide a display apparatus having a structure that allows the plurality of printed circuit boards to overlap each other in a front and rear direction and to be disposed at positions spaced apart from each other.

Embodiments of the present disclosure are not limited to the above-mentioned embodiments. Other embodiments and advantages of the present disclosure that are not mentioned may be understood based on following descriptions, and may be more clearly understood based on embodiments of the present disclosure. Further, it will be easily understood that the embodiments and advantages of the present disclosure may be realized using means shown in the claims and combinations thereof.

An embodiment of a display apparatus may include a display, a cover, a printed circuit board, and a mounting portion.

The display may display an image or a video and may be approximately and entirely formed of a rectangular thin plate.

The cover may be coupled with the display and provide a space. The cover may be formed in a rectangular box shape as a whole, and may include a first casing and a second casing.

The first casing is disposed to face the mounting portion, and may form a bottom face of the cover. The second casing may be formed to be bent from the first casing at edges of the first casing, and may cooperate with the first casing to define a space in the cover.

The printed circuit board may be electrically connected to the display and may have a controller for controlling operation of the image or the video displayed on the display.

The printed circuit board may be accommodated in the space and may include a plurality of printed circuit boards. The printed circuit boards may have different sizes and shapes. For example, the printed circuit board may include a first board, a second board, and a third board.

The first board may be disposed in the rear of the display. That is, the first board may be disposed at a position most adjacent to the display among the boards.

The second board may be disposed in the rear of the first board and may be formed to have a substantially rectangular shape. The third board may be disposed in the rear of the second board, may be formed to have a substantially rectangular shape, and may have a larger area than the second board.

In the display apparatus, in order to accommodate the plurality of boards, which have the relatively large sizes and have a total area exceeding an accommodation area of the cover, the boards may be accommodated in the cover as at least portions thereof are disposed to overlap each other in the front and rear direction of the display apparatus.

The mounting portion may be coupled to the display and accommodated in the cover. The mounting portion may be approximately formed in a plate shape and may be coupled to a rear face of the display.

A first mounting protrusion on which the printed circuit board is mounted may be formed on the mounting portion. The first mounting protrusion may protrude from a rear face of the mounting portion rearwardly of the mounting portion.

The plurality of printed circuit boards, that is, the first board, the second board, and the third board may be mounted on the first mounting protrusion. Further, the first mounting protrusion may include a plurality of mounting grooves defined at positions spaced apart from each other in a length direction of the first mounting protrusion such that the printed circuit boards are spaced apart from each other.

In order to stably mount the plurality of boards, a plurality of first mounting protrusions may be disposed. In this regard, the first mounting protrusions may be disposed at positions on the mounting portion spaced apart from each other in a direction intersecting the length direction of the first mounting protrusions.

The plurality of mounting grooves may be defined at the positions spaced apart from each other in the front and rear direction of the display apparatus. The first board, the second board, and the third board may be mounted on each of the plurality of mounting grooves. Therefore, the distance in the front and rear direction between the boards may be determined by the distance in the front and rear direction between the mounting grooves.

The first mounting protrusion may have a first fastening groove defined therein for fastening. The first fastening groove may be defined as recessed from an end of the first mounting protrusion and defined in the length direction of the first mounting protrusion, and a fastening mechanism such as a screw bolt may be inserted into the first fastening groove.

The first casing may have a through-coupling-portion defined at a position corresponding to the first fastening groove and into which the fastening mechanism is inserted. The fastening mechanism may be fastened to the through-coupling-portion of the first casing and the first fastening groove of the first mounting protrusion, so that the cover and the mounting portion may be stably coupled to each other.

The first mounting protrusion may include a first small-diameter portion, a second small-diameter portion, a third small-diameter portion, a first large-diameter portion, and a second large-diameter portion. In the first mounting protrusion, the small-diameter portion and the large-diameter portion are alternately formed in the length direction thereof and a portion thereof corresponding to the small-diameter portion becomes the mounting groove, so that the plurality of mounting grooves may be defined to be spaced apart from each other in the length direction of the first mounting protrusion.

The first small-diameter portion may have the mounting groove in which the first board is seated. Because the first board is placed at a forefront portion in the display apparatus compared to other boards, the first small-diameter portion may be formed at a forefront portion in the first mounting protrusion compared to other small-diameter portions.

The second small-diameter portion may be formed at a position spaced apart from the first small-diameter portion in the length direction of the first mounting protrusion, and may have the mounting groove in which the second board is seated. The second small-diameter portion may be formed between the first small-diameter portion and the third small-diameter portion in the front and rear direction of the first mounting protrusion.

The third small-diameter portion may be formed at a position spaced apart from the second small-diameter portion in the length direction of the first mounting protrusion, and the third board is seated in the third small-diameter portion. The large-diameter portion may not be disposed at an end of the third small-diameter portion.

Each board may have a recessed portion or a through-portion to be fitted into the mounting groove. The first board may have a first recessed portion defined therein, the second board may have a second recessed portion defined therein, and the third board may have the first through-portion defined therein.

In order to mount the second board and the third board onto the mounting portion more stably, a second mounting protrusion may be formed on the mounting portion. The second mounting protrusion may serve to mount the second board and the third board onto the mounting portion together with the first mounting protrusion.

The second mounting protrusion may be formed to protrude from the rear face of the mounting portion rearwardly of the display apparatus. A plurality of second mounting protrusions may be disposed and the second mounting protrusions may be formed at positions on the mounting portion spaced apart from each other.

The second board or the third board may be coupled to the second mounting protrusion as a coupling mechanism such as a screw bolt is fastened thereto while in contact with the end of the second mounting protrusion. Therefore, the second mounting protrusion may have a second fastening groove defined as recessed from an end of the second mounting protrusion, defined in a length direction of the second mounting protrusion, and into which the fastening mechanism is inserted.

The second mounting protrusion may include a first boss and a second boss. The first boss may be coupled to the second board and support the second board. The second boss may be coupled to the third board and may support the third board.

The first boss or the second boss may include a plurality of first bosses or a plurality of second bosses to more stably support the second or third board. The plurality of the first bosses or the plurality of the second bosses may be formed at positions spaced apart from each other in the mounting portion.

Each of the second board and the third board may have a fastening hole to be coupled to each of the first boss and the second boss via the coupling mechanism.

The through-coupling-portion may include a pressing portion and a third fastening hole. The pressing portion may be formed as recessed from the rear face of the first casing and protruded from the front face of the first casing to press one face of the printed circuit board. The third fastening hole may be defined to extend through the pressing portion, and the fastening mechanism may be inserted into the third fastening hole.

One embodiment of a display apparatus may include a display, a cover coupled to the display and providing therein a space, a plurality of printed circuit boards accommodated in the space, and a mounting portion coupled to the display, accommodated in the space, and having a first mounting protrusion formed thereon, wherein the printed circuit boards are mounted on the first mounting protrusion, and the first mounting protrusion may include a plurality of mounting grooves respectively, wherein the printed circuit boards are mounted in the plurality of mounting grooves, wherein the plurality of mounting grooves are defined at positions spaced apart from each other in a length direction of the first mounting protrusion such that the plurality of the printed circuit boards are disposed to be spaced apart from each other.

In the display apparatus according to the present disclosure, as the plurality of printed circuit boards are disposed to at least partially overlap each other, the relatively large printed circuit board may be easily accommodated in the cover. Therefore, even when the total area of the plurality of printed circuit boards exceeds the accommodation area of the cover, the printed circuit board may be easily accommodated in the cover, thereby increasing the space efficiency of the cover.

Further, because the display apparatus has a structure free from the size of the printed circuit board, there is no need to reduce the size of the printed circuit board excessively. In addition, the performance degradation of the display apparatus resulted from excessive omission of the elements and circuit structures in the process of reducing the size of the printed circuit board may be suppressed.

In addition, in the display apparatus according to the present disclosure, because the plurality of mounting grooves defined in the first coupling protrusion are defined to be spaced apart from each other in the front and rear direction of the display apparatus, the printed circuit boards mounted in the mounting grooves are sufficiently spaced apart from each other, so that the damage and the performance degradation due to the interference or the contact between the boards may be suppressed.

Effects of the present disclosure are not limited to the above-mentioned effects, and other effects as not mentioned will be clearly understood by those skilled in the art from following descriptions.

The purposes, solutions, and effects of the disclosure as described above does not specify essential features of claims. Thus, the scope of claims is not limited by the purposes, solutions, and effects of the disclosure as described above.

DETAILED DESCRIPTION

Figure 1:
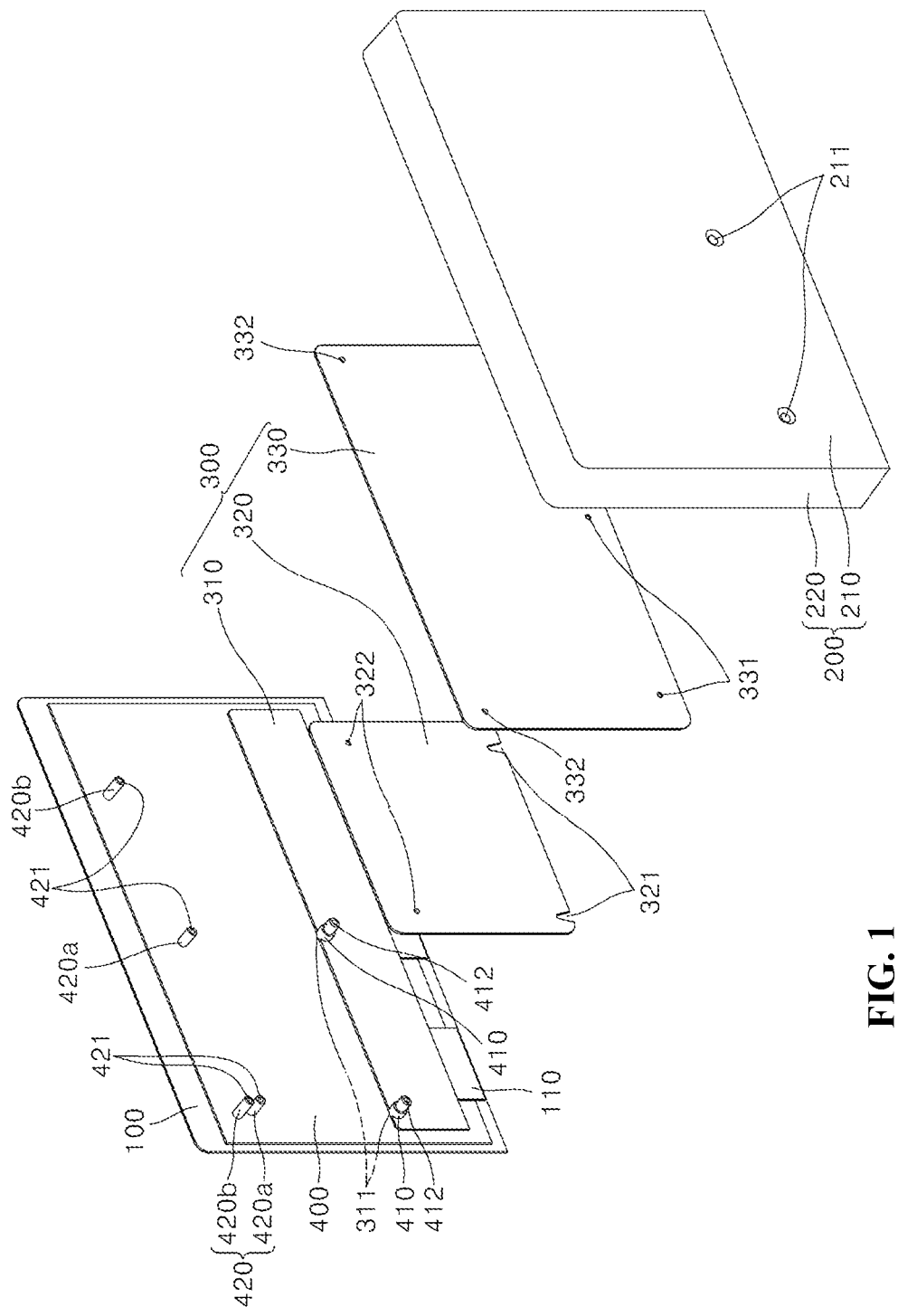
FIG. 1 is an exploded perspective view of a display apparatus according to one embodiment.

Advantages and features of the present disclosure, and how to achieve them will become apparent with reference to the embodiments described below in detail in conjunction with the accompanying drawings. However, the present disclosure is not limited to the embodiments as disclosed below, but will be implemented in a variety of different forms. Only these embodiments make the present disclosure complete, and are constructed to fully inform those having common knowledge in the technical field to which the present disclosure belongs of a scope of the disclosure.

A shape, a size, a ratio, an angle, a number, etc., disclosed in the drawings for illustrating embodiments of the present disclosure are exemplary, and the present disclosure is not limited thereto. The same reference numerals refer to the same elements herein. Further, in describing the present disclosure, when it is determined that a detailed description of a related known element may unnecessarily obscure gist of the present disclosure, the detailed description thereof will be omitted. As used herein, the singular forms "a" and "an" are intended to include the plural forms as well, unless the context clearly indicates otherwise. It will be further understood that the terms "comprises," "comprising," "includes," and "including" when used in this specification, specify the presence of the stated features, integers, operations, elements, and/or components, but do not preclude the presence or addition of one or more other features, integers, operations, elements, components, and/or portions thereof.

In interpreting a numerical value, the value is interpreted as including an error range unless there is no separate explicit description thereof.

It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present. In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after," "subsequent to," "before," etc., another event may occur therebetween unless "directly after," "directly subsequent" or "directly before" is not indicated.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In descriptions of temporal relationships, for example, temporal precedent relationships between two events such as "after," "subsequent to," "before," etc., another event may occur therebetween unless "directly after," "directly subsequent" or "directly before" is not indicated. The features of the various embodiments of the present disclosure may be partially or entirely combined with each other, and may be technically associated with each other or operate with each other. The embodiments may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the apparatus in use or in operation, in addition to the orientation depicted in the figures. For example, when the apparatus in the drawings may be turned over, elements described as "below" or "beneath" or "under" other elements or features would then be oriented "above" the other elements or features. Thus, the example terms "below" and "under" may encompass both an orientation of above and below. The apparatus may be otherwise oriented for example, rotated 90 degrees or at other orientations, and the spatially relative descriptors used herein should be interpreted accordingly.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Throughout the specification, a "vertical direction" refers to a vertical direction of a display apparatus in a state of being installed for daily use. A "left and right direction" means a direction orthogonal to a vertical direction and a "front and rear direction" means a direction orthogonal to both the vertical direction and the left and right direction. A "lateral direction" has the same meaning as the left and right direction. Such terms may be used interchangeably in the present disclosure.

Figure 2:
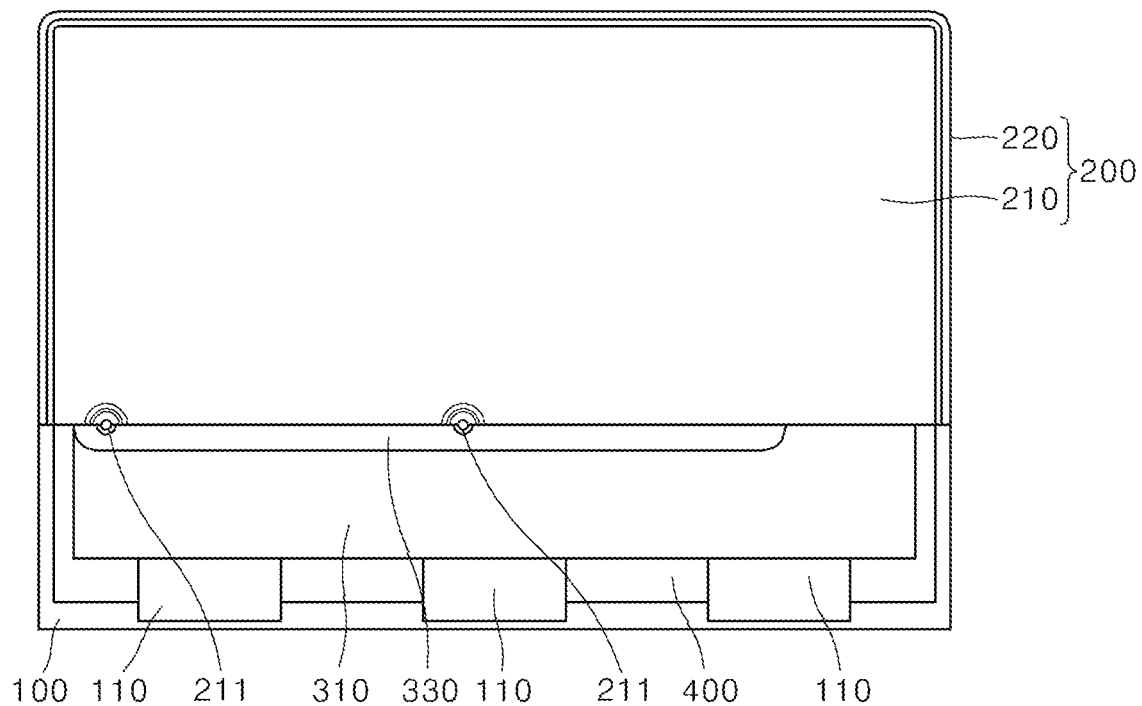
FIG. 2 is a diagram showing a state in which a portion of a display apparatus according to one embodiment is cut.
Figure 3:
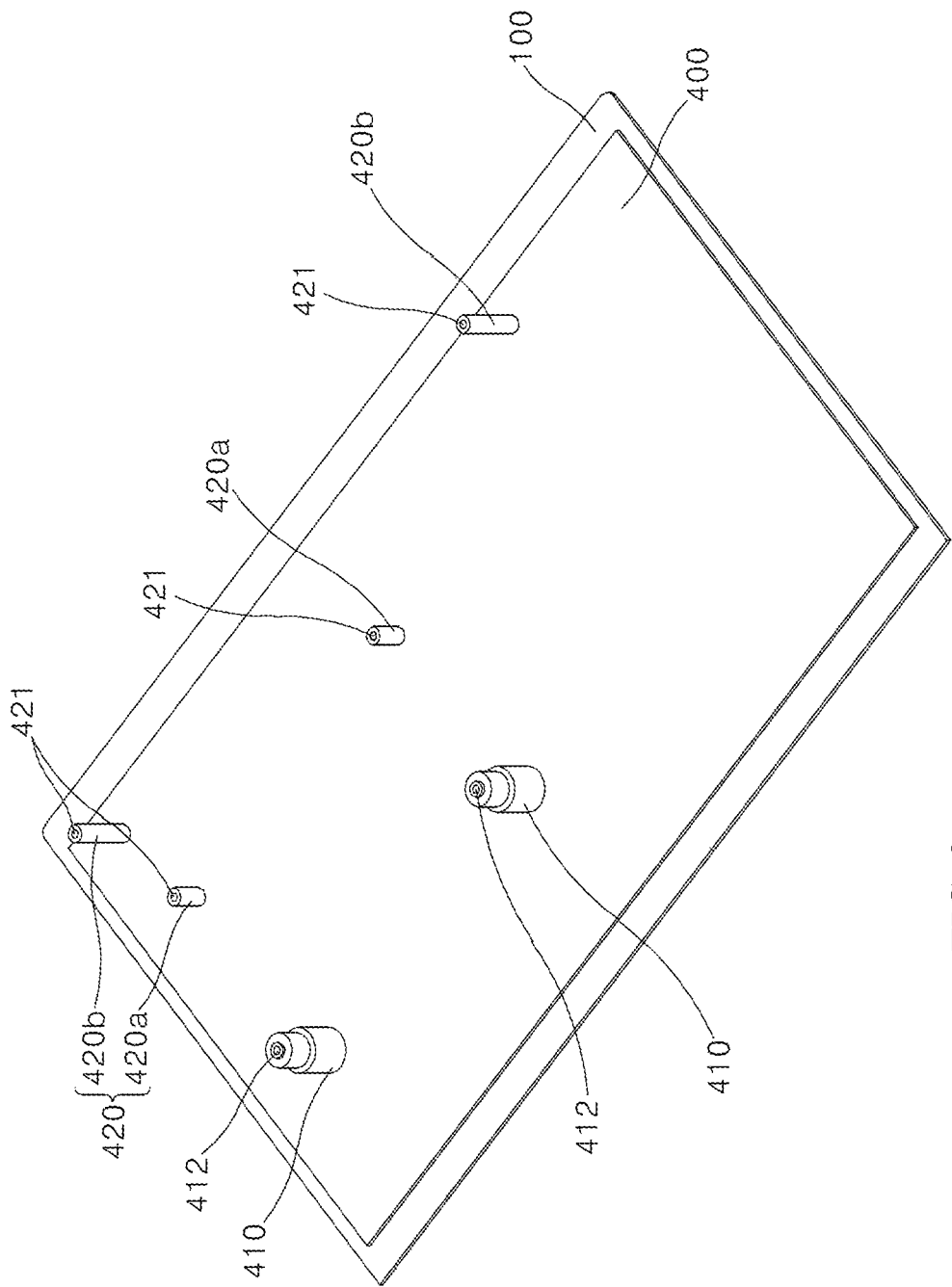
FIG. 3 is a perspective view showing a display and a mounting portion according to one embodiment.

FIG. 1 is an exploded perspective view of a display apparatus according to one embodiment. FIG. 2 is a diagram showing a state in which a portion of a display apparatus according to one embodiment is cut. FIG. 3 is a perspective view showing a display 100 and a mounting portion 400 (which may also be referred to herein as a mounting plate 400) according to one embodiment.

The display apparatus according to an embodiment may include, for example, a liquid crystal display apparatus (LCD), a quantum dot (QD) display apparatus, a field emission display apparatus (FED), an electrowetting display apparatus (EWD), and an organic light-emitting display apparatus (OLED), etc. However, the present disclosure is not limited thereto.

The display apparatus according to an embodiment may include the display 100, a cover 200, a printed circuit board 300, and the mounting portion 400.

The display 100 is able to display an image or a video, and a display scheme thereof is the same as described above. The display 100 may be approximately and entirely formed of a rectangular thin plate.

The cover 200 may be coupled with the display 100 and provide a space in which parts are accommodated. The display 100 and the cover 200 may be coupled to each other via, for example, a coupling mechanism such as a screw bolt, an adhesive, or a laser melting method, but the present disclosure may not be limited thereto.

The cover 200 may be made of a metal material such as aluminum having good corrosion resistance, durability, and manufacturability or a plastic material that is easy to be injection-molded, but the present disclosure may not be limited thereto.

The cover 200 may be formed in a rectangular box shape as a whole, and may include a first casing 210 and a second casing 220. The first casing 210 is disposed to face the mounting portion 400 to be described later, and may form a bottom face of the cover 200.

The second casing 220 may be formed to be bent from the first casing 210 at edges of the first casing 210, and may define an accommodation space of the printed circuit board 300 therein. The second casing 220 may be coupled to the display 100 so as to be in contact with edges of a rear face of the display 100. The printed circuit board 300 may be accommodated in the space defined by the second casing 220.

The printed circuit board 300 may be electrically connected to the display 100 and may have a controller for controlling operation of the image or the video displayed on the display 100.

Various elements and wirings including active elements and manual elements for receiving electricity from external power source and supplying the electricity to the display 100, transmitting data to the display 100, and controlling an operation thereof may be formed on the printed circuit board 300.

The printed circuit board 300 may be accommodated in the cover 200 and may include a plurality of printed circuit boards. The printed circuit boards 300 may have different sizes and shapes. For example, the printed circuit board 300 may include a first board 310, a second board 320, and a third board 330. Although not shown in the drawing, wirings for electrically connecting the first board 310, the second board 320, and the third board 330 to each other may be connected to the boards.

The first board 310, the second board 320, and the third board 330 may perform different functions or perform the same function in the display apparatus.

The first board 310 may be disposed in the rear of the display 100. That is, the first board 310 may be disposed at a position most adjacent to the display 100 among the boards. The first board 310 may be formed in a rectangular shape having a smaller width and a greater vertical dimension than the second board 320 and the third board 330.

The first board 310 may be in direct electrical connection with the display 100. Accordingly, the display apparatus may include a connector 110 for electrically connecting the first board 310 and the display 100 to each other. In this regard, the connector 110 may include a plurality or connectors and may be made of a flexible material so as to be easily folded.

The second board 320 may be disposed in the rear of the first board 310 and may be formed to have a substantially rectangular shape. The third board 330 may be disposed in the rear of the second board 320, may be formed to have a substantially rectangular shape, and may have a larger area than the second board 320.

A total area of the first board 310, the second board 320, and the third board 330 may be greater than areas of the display 100 and the first casing 210. Accordingly, it may be difficult to accommodate all of the first board 310, the second board 320, and the third board 330 in the cover 200.

In this case, each board may be accommodated in the cover 200 by reducing a size, that is, the area of each board. Accordingly, because the size of each board is reduced, it is necessary to omit some of the elements and the wirings that allow each board to operate smoothly. In this case, a performance of the board may be lowered, and thus, a performance of the entire display apparatus may be lowered.

For the above reasons, it is difficult to reduce the size of the board, so that a structure for accommodating the boards having relatively large areas in the cover 200 is required. In an embodiment, a display apparatus having a structure that may stably accommodate the boards of the relatively large areas in the cover 200 without reducing sizes of the boards is proposed.

In an embodiment, in order to accommodate the plurality of boards, which have the relatively large sizes and have a total area exceeding an accommodation area of the cover 200, in the cover 200, the boards may be accommodated in the cover 200 as at least portions thereof are disposed to overlap each other in the front and rear direction of the display apparatus.

That is, at least portions of the first board 310, the second board 320, and the third board 330 may be disposed to overlap each other in the front and rear direction of the display apparatus.

For example, at least a portion of the second board 320 may be disposed to overlap the first board 310 in the front and rear direction of the display apparatus. Further, at least a portion of the third board 330 may be disposed to overlap the second board 320 in the front and rear direction of the display apparatus.

The boards need to be disposed to be spaced apart from each other at an appropriate distance in the front and rear direction such that the elements mounted on the respective boards do not collide with each other and an electrical short does not occur due to contact between the boards in a portion where the boards overlap each other.

Therefore, in the display apparatus, the plurality of boards need to be spaced apart from each other so as not to be in contact with each other while overlapping each other in the front and rear direction. For such structure, the display apparatus according to an embodiment may have the mounting portion 400.

The mounting portion 400 may be coupled to the display 100 and accommodated in the cover 200. The mounting portion 400 may be approximately formed in a plate shape and may be coupled to a rear face of the display 100. For example, the mounting portion 400 and the display 100 may be coupled to each other by an adhesive, but the present disclosure may not be limited thereto.

A first mounting protrusion 410 on which the printed circuit board 300 is mounted may be formed on the mounting portion 400. The first mounting protrusion 410 may protrude from a rear face of the mounting portion 400 rearwardly of the mounting portion 400.

The plurality of printed circuit boards 300, that is, the first board 310, the second board 320, and the third board 330 may be mounted on the first mounting protrusion 410. Further, the first mounting protrusion 410 may include a plurality of mounting grooves 411 defined at positions spaced apart from each other in a length direction of the first mounting protrusion 410 such that the printed circuit boards 300 are spaced apart from each other.

The first mounting protrusion 410 may be disposed such that the length direction thereof is directed in the front and rear direction of the display apparatus. In order to stably mount the plurality of boards, a plurality of first mounting protrusions 410 may be disposed. In this regard, the first mounting protrusions 410 may be disposed at positions on the mounting portion 400 spaced apart from each other in a direction intersecting the length direction of the first mounting protrusions 410.

Figure 4:
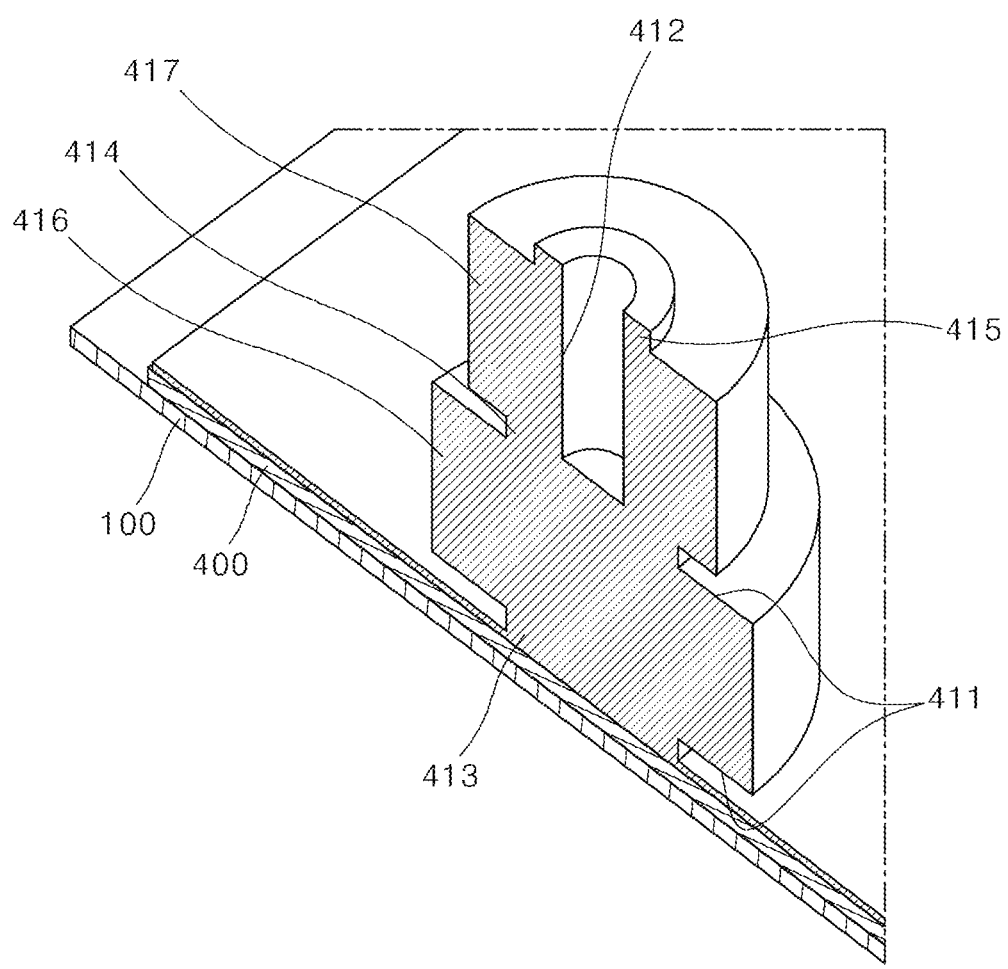
FIG. 4 is an enlarged cross-sectional perspective view of a portion in FIG. 3.
Figure 5:
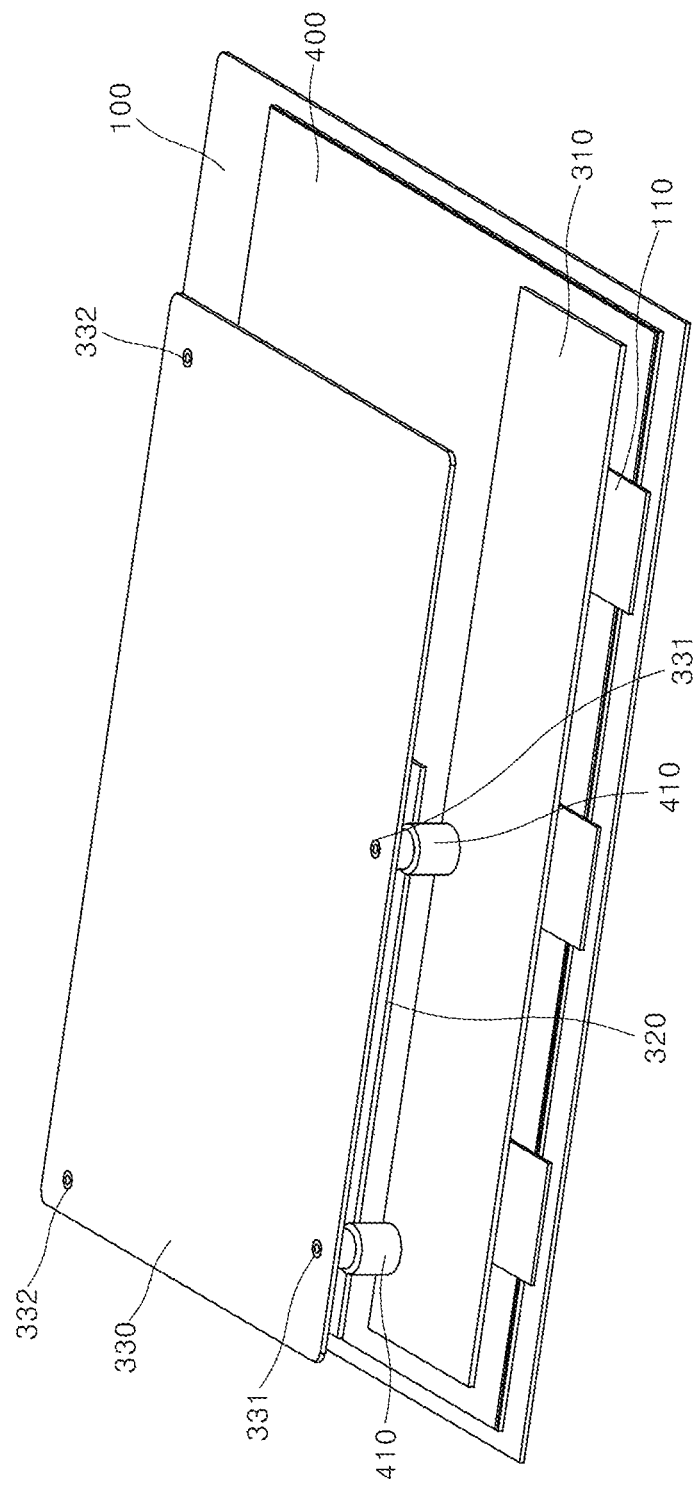
FIG. 5 is a diagram in which a cover is omitted from a display apparatus according to one embodiment.
Figure 6:
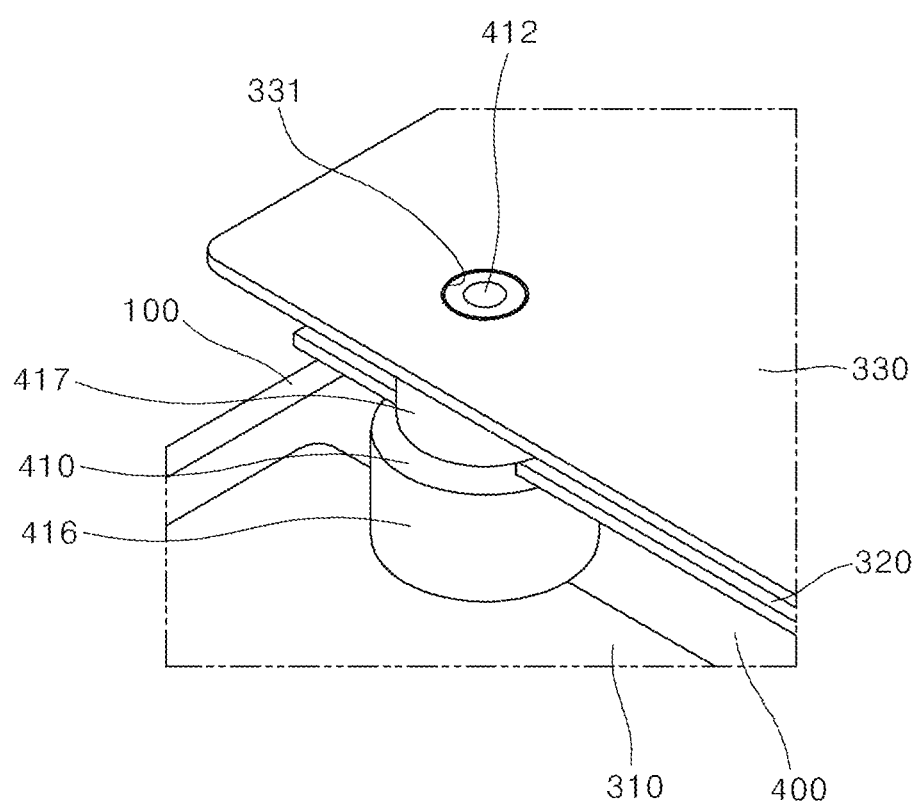
FIG. 6 is an enlarged cross-sectional perspective view of a portion in FIG. 5.

Hereinafter, a structure of the first mounting projection 410 will be described in detail with reference to the drawings. FIG. 4 is an enlarged cross-sectional perspective view of a portion in FIG. 3. FIG. 5 is a diagram in which the cover 200 is omitted from a display apparatus according to one embodiment. FIG. 6 is an enlarged cross-sectional perspective view of a portion in FIG. 5.

As shown in FIG. 4, the plurality of mounting grooves 411 may be defined at the positions spaced apart from each other in the front and rear direction of the display apparatus.

The first board 310, the second board 320, and the third board 330 may be mounted on each of the plurality of mounting grooves 411. Therefore, the distance in the front and rear direction between the boards may be determined by the distance in the front and rear direction between the mounting grooves 411.

In this regard, the first mounting protrusion 410 may have a first fastening groove 412 defined therein for fastening. The first fastening groove 412 may be defined as recessed from an end of the first mounting protrusion 410 and defined in the length direction of the first mounting protrusion 410, and a fastening mechanism such as a screw bolt may be inserted into the first fastening groove 412.

Further, the first casing 210 may have a through-coupling-portion 211 defined at a position corresponding to the first fastening groove 412 and into which the fastening mechanism is inserted. The fastening mechanism may be fastened to the through-coupling-portion 211 of the first casing 210 and the first fastening groove 412 of the first mounting protrusion 410, so that the cover 200 and the mounting portion 400 may be stably coupled to each other.

As shown in FIG. 4, the first mounting protrusion 410 may include a first small-diameter portion 413, a second small-diameter portion 414, a third small-diameter portion 415, a first large-diameter portion 416, and a second large-diameter portion 417. In this regard, the small-diameter portion means a portion with a relatively small diameter and the large-diameter portion means a relatively large diameter. The small-diameter portions may also be referred to herein as a reduced diameter portions. Unless the context and language clearly dictates otherwise, each of the small-diameter portions has a diameter that is less than a diameter of each of the large-diameter portions.

In an embodiment, in the first mounting protrusion 410, the small-diameter portion and the large-diameter portion are alternately formed in the length direction thereof and a portion thereof corresponding to the small-diameter portion becomes the mounting groove 411, so that the plurality of mounting grooves 411 may be defined to be spaced apart from each other in the length direction of the first mounting protrusion 410. In this regard, a length of each small-diameter portion measured in the length direction of the first mounting protrusion 410 may be a value corresponding to a thickness of each board.

The first small-diameter portion 413 may have the mounting groove 411 in which the first board 310 is seated. Because the first board 310 is placed at a forefront portion in the display apparatus compared to other boards, the first small-diameter portion 413 may be formed at a forefront portion in the first mounting protrusion 410 compared to other small-diameter portions.

The second small-diameter portion 414 may be formed at a position spaced apart from the first small-diameter portion 413 in the length direction of the first mounting protrusion 410, and may have the mounting groove 411 in which the second board 320 is seated. The second small-diameter portion 414 may be formed between the first small-diameter portion 413 and the third small-diameter portion 415 in the front and rear direction of the first mounting protrusion 410.

The third small-diameter portion 415 may be formed at a position spaced apart from the second small-diameter portion 414 in the length direction of the first mounting protrusion 410, and the third board 330 is seated in the third small-diameter portion 415. As shown in FIG. 4, the large-diameter portion may not be disposed at an end of the third small-diameter portion 415.

Accordingly, in the third board 330, a first through-portion 331 may be defined such that the third small-diameter portion 415 is inserted thereinto. That is, unlike the first board 310 and the second board 320 that move in the lateral direction of the display apparatus and fit into the first mounting protrusion 410, the third board 330 moves in the front and rear direction of the display apparatus and is seated on the third small-diameter portion 415 to be fitted with the first mounting protrusion 410.

The first large-diameter portion 416 may be disposed between the first small-diameter portion 413 and the second small-diameter portion 414. The second large-diameter portion 417 may be disposed between the second small-diameter portion 414 and the third small-diameter portion 415. The large-diameter portions may space the small-diameter portions apart from each other in the length direction of the first mounting protrusion 410.

Accordingly, the boards mounted on the respective small-diameter portions are disposed to be spaced apart from each other in the length direction of the first mounting protrusion 410, so that the boards may be stably accommodated in the cover 200 without interference or contact with each other.

A length measured in the length direction of the first mounting protrusion 410 of each large-diameter portion may set a distance between two boards in the front and rear direction. Therefore, the length of each large-diameter portion may be designed to an appropriate value such that the boards do not contact or interfere with each other in consideration of shape characteristics such as the thickness of each board and other matters such as a size of the element mounted on each board.

In one example, each board may have a recessed portion or a through-portion to be fitted into the mounting groove 411. The first board 310 may have a first recessed portion 311 defined therein, the second board 320 may have a second recessed portion 321 defined therein, and the third board 330 may have the first through-portion 331 defined therein.

The first board 310 may include the first recessed portion 311 defined as recessed from an edge of the first board 310 and mounted onto the first small-diameter portion 413. The second board 320 may include the second recessed portion 321 defined as recessed from an edge of the second board 320 and mounted onto the second small-diameter portion 414.

Each of the first recessed portion 311 and the second recessed portion 321 may be defined in an approximately semicircular recessed shape at the edge of each board. Therefore, the first board 310 and the second board 320 may move in the lateral direction of the display apparatus and be coupled to the first mounting protrusion 410 as the first recessed portion 311 and the second recessed portion 321 are respectively fitted into the first small-diameter portion 413 and the second small-diameter portion 414, which become the mounting grooves 411.

The third board 330 may include the first through-portion 331 defined to extend through the third board 330 and seated on the third small-diameter portion 415. Accordingly, the third board 330 may move in a forward direction of the display apparatus and be coupled to the first mounting protrusion 410 as the third small-diameter portion 415 is inserted into the first through-portion 331.

In one example, in order to mount the second board 320 and the third board 330 onto the mounting portion 400 more stably, a second mounting protrusion 420 may be formed on the mounting portion 400. The second mounting protrusion 420 may serve to mount the second board 320 and the third board 330 onto the mounting portion 400 together with the first mounting protrusion 410.

The mounting portion 400 may further include the second mounting protrusion 420 formed to protrude in the front and rear direction of the display apparatus and onto which at least one of the second board 320 and the third board 330 is mounted.

The second mounting protrusion 420 may be formed to protrude from the rear face of the mounting portion 400 rearwardly of the display apparatus. A plurality of second mounting protrusions 420 may be disposed and the second mounting protrusions 420 may be formed at positions on the mounting portion 400 spaced apart from each other.

As one face of the second board 320 or the third board 330 is in contact with an end of the second mounting protrusion 420, the second board 320 or the third board 330 may be supported by the second mounting protrusion 420. The second board 320 or the third board 330 may be coupled to the second mounting protrusion 420 as a coupling mechanism such as a screw bolt is fastened thereto while in contact with the end of the second mounting protrusion 420.

Therefore, the second mounting protrusion 420 may have a second fastening groove 421 defined as recessed from an end of the second mounting protrusion, defined in a length direction of the second mounting protrusion 420, and into which the fastening mechanism is inserted. As the coupling mechanism is fastened to the second fastening groove 421, the second mounting protrusion 420 and the second board 320 or the third board 330 may be coupled to each other.

The second mounting protrusion 420 may include a first boss 420a and a second boss 420b. The first boss 420a may be coupled to the second board 320 and support the second board 320. The second boss 420b may be coupled to the third board 330 and may support the third board 330.

The first boss 420a or the second boss 420b may include a plurality of first bosses or a plurality of second bosses to more stably support the second or third board. The plurality of the first bosses 420a or the plurality of the second bosses 420b may be formed at positions spaced apart from each other in the mounting portion 400.

Lengths of the first boss 420a and the second boss 420b may be different from each other. In the display apparatus, the second board 320 may be disposed in front of the third board 330, and the third board 330 may be disposed in the rear of the second board 320.

Therefore, the first boss 420a supporting the second board 320 may be relatively short and the second boss 420b supporting the third board 330 may be relatively long such that the second board 320 is placed in front of the third board 330. That is, the second boss 420b may be formed longer than the first boss 420a.

Each of the second board 320 and the third board 330 may have a fastening hole to be coupled to each of the first boss 420a and the second boss 420b via the coupling mechanism.

The second board 320 may include a first fastening hole 322 defined at a position corresponding to the first boss 420a and into which the fastening mechanism is inserted. The third board 330 may include a second fastening hole 332 defined at a position corresponding to the second boss 420b and into which the fastening mechanism is inserted.

The coupling mechanism may be fastened to the second fastening groove 421 of the first boss 420a and the first fastening hole 322 of the second board 320, so that the second board 320 may be coupled to the first boss 420a. Further, the coupling mechanism may be fastened to the second fastening groove 421 of the second boss 420b and the second fastening hole 332 of the third board 330, so that the third board 330 may be coupled to the second boss 420b.

A difference in length between the first boss 420a and the second boss 420b may define a separation distance in the front and rear direction between the second board 320 and the third board 330. Accordingly, a difference value in the length between the first boss 420a and the second boss 420b may be set to a value corresponding to a length of the second large-diameter portion 417.

Figure 7:
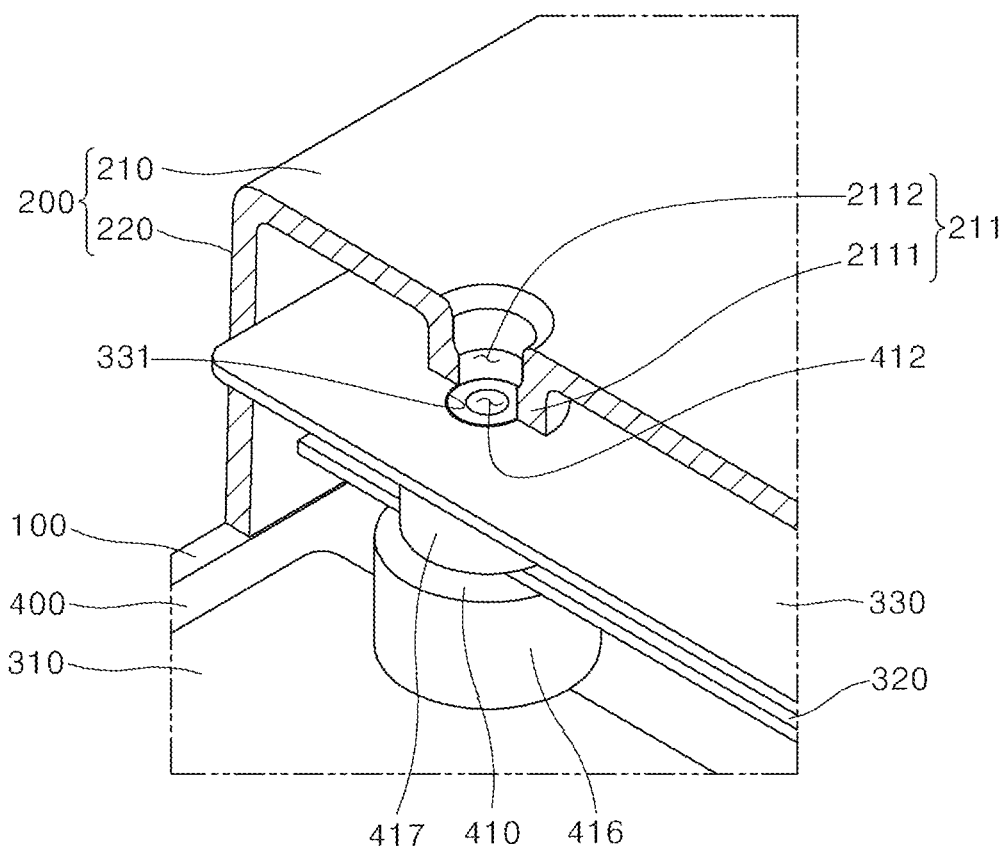
FIG. 7 is an enlarged cross-sectional perspective view of a portion in a display apparatus in a state in which a cover is mounted therein, according to one embodiment.

FIG. 7 is an enlarged cross-sectional perspective view of a portion in a display apparatus in a state in which the cover 200 is mounted therein, according to one embodiment.

As shown in FIG. 7, the through-coupling-portion 211 may include a pressing portion 2111 and a third fastening hole 2112. The pressing portion 2111 may be formed as recessed from the rear face of the first casing 210 and protruded from the front face of the first casing 210 to press one face of the printed circuit board 300. The third fastening hole 2112 may be defined to extend through the pressing portion 2111, and the fastening mechanism may be inserted into the third fastening hole 2112.

When the coupling mechanism is fastened to the third fastening hole 2112 and the third board 330 and the cover 200 are coupled to each other, the pressing portion 2111 protruding frontwards may press the third board 330 and space the rear face of the third board 330 and the front face of the first casing 210 from each other.

The pressing portion 2111 may define a space between the third board 330 and the first casing 210, and the element that is mounted on the rear face of the third board 330 and has a meaningful volume may be prevented from being in contact with and interfered by the first casing 210 by such space.

Figure 8:
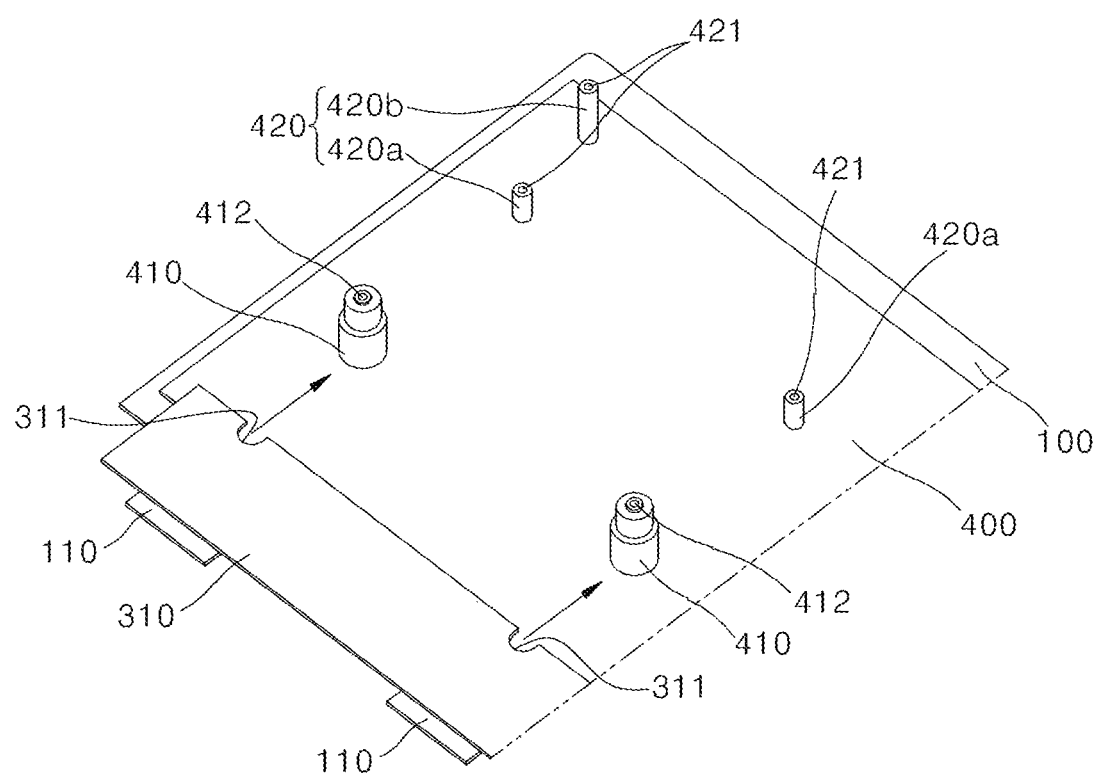
FIG. 8 is a diagram showing a process of mounting a first board in a display apparatus.
Figure 9:
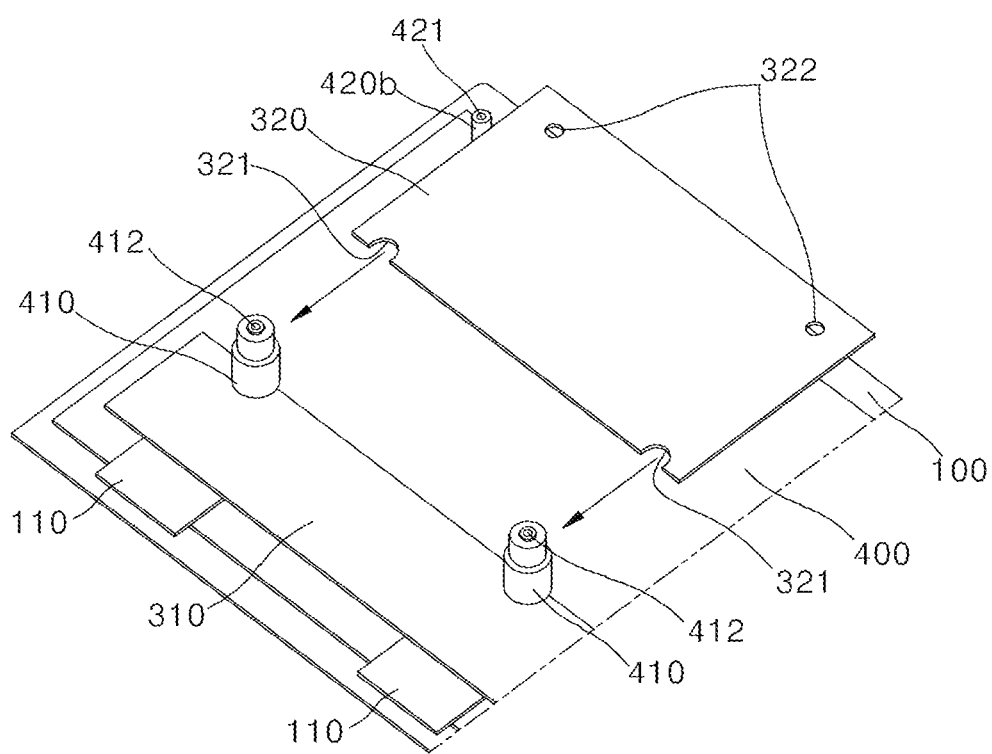
FIG. 9 is a diagram showing a process of mounting a second board in a display apparatus.
Figure 10:
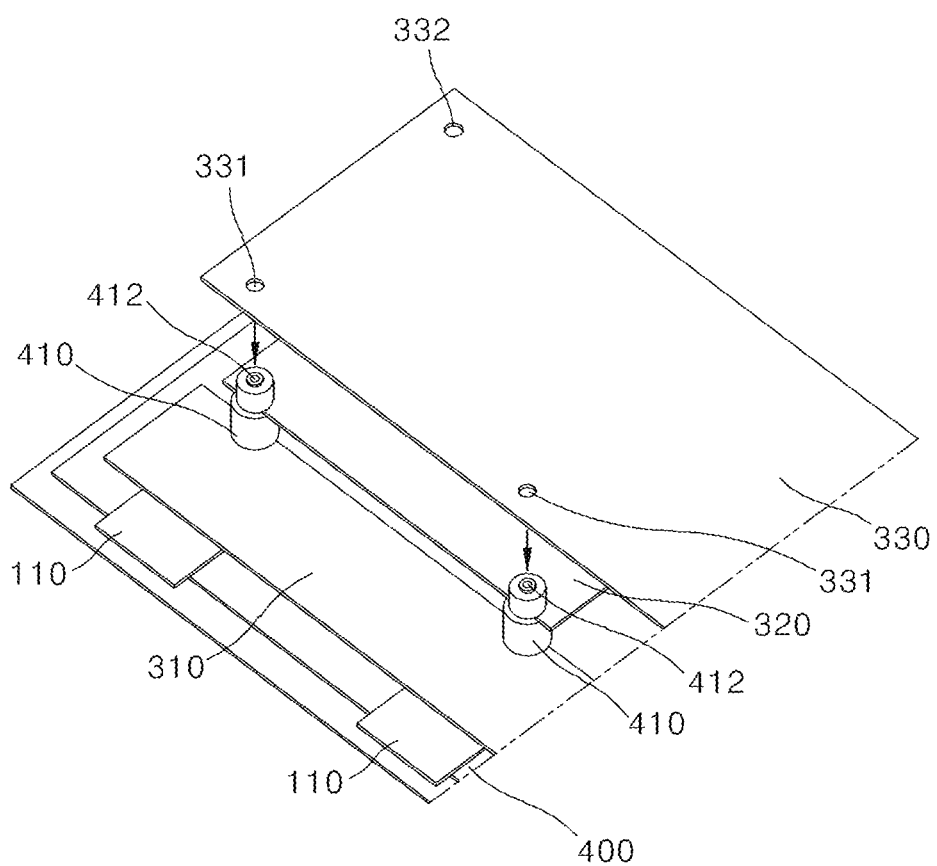
FIG. 10 is a diagram showing a process of mounting a third board in a display apparatus.
Figure 11:
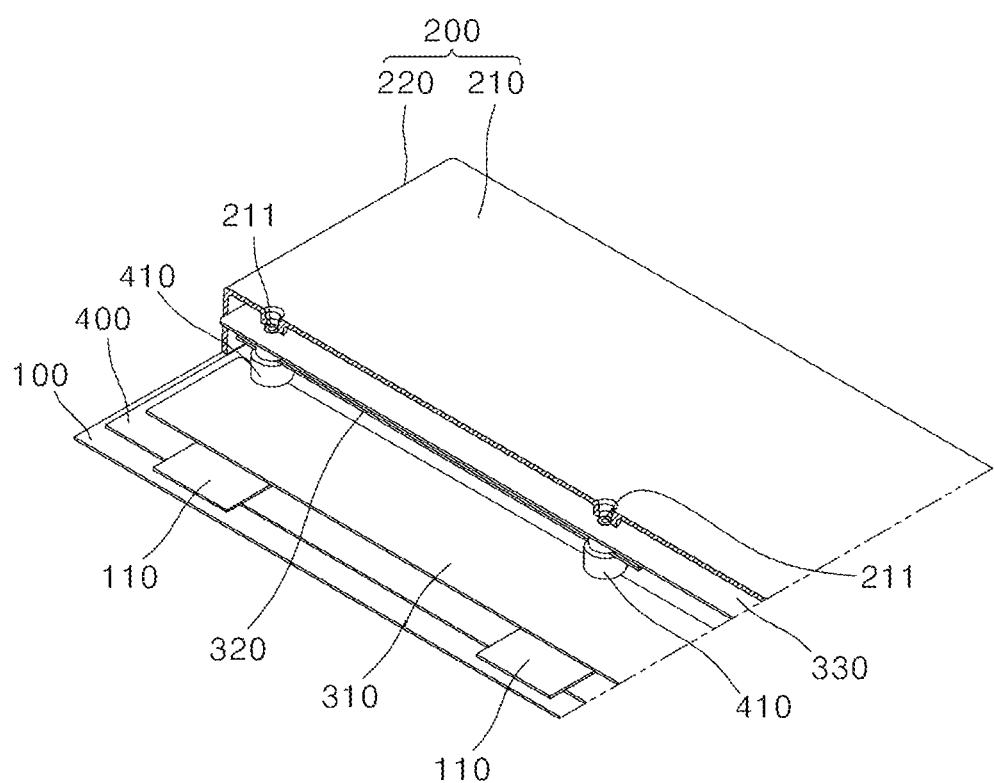
FIG. 11 is a diagram showing a process of mounting a cover in a display apparatus.

FIG. 8 is a diagram showing a process of mounting the first board 310 in a display apparatus. FIG. 9 is a diagram showing a process of mounting the second board 320 in a display apparatus. FIG. 10 is a diagram showing a process of mounting the third board 330 in a display apparatus. FIG. 11 is a diagram showing a process of mounting the cover 200 in a display apparatus.

Arrows shown in FIGS. 8, 9 and 10 indicate directions in which the boards move when the display apparatus is assembled. Hereinafter, an assembly sequence of the display apparatus according to an embodiment will be described with reference to the drawings.

As shown in FIG. 8, the first board 310 is moved in the lateral direction of the mounting portion 400 to insert the first recessed portion 311 of the first board 310 into the first small-diameter portion 413 of the first mounting protrusion 410, so that the first board 310 is coupled to the first mounting protrusion 410.

Next, as shown in FIG. 9, the second board 320 is moved in the lateral direction of the mounting portion 400 to insert the second recessed portion 321 of the second board 320 into the second small-diameter portion 414 of the first mounting protrusion 410, so that the second board 320 is coupled to the first mounting protrusion 410.

Further, the second board 320 is coupled to the first boss 420a by inserting the coupling mechanism into the second fastening groove 421 of the first boss 420a and the first fastening hole 322 of the second board 320.

Next, as shown in FIG. 10, the third board 330 is moved in the forward direction to the mounting portion 400 to insert the third small-diameter portion 415 of the first mounting protrusion 410 into the first through-portion 331 of the third board 330, so that the third board 330 is coupled to the first mounting protrusion 410.

Further, the third board 330 is coupled to the second boss 420b by inserting the coupling mechanism into the second fastening groove 421 of the second boss 420b and the second fastening hole 332 of the third board 330.

Next, as shown in FIG. 11, the cover 200 covers the rear face of the display 100 and the coupling mechanism is inserted into the through-coupling-portion 211 of the first casing 210 and the first fastening groove 412 of the first coupling protrusion, so that the cover 200 is coupled to the first coupling protrusion.

When necessary, in order to firmly couple the cover 200 and the display 100 to each other, the rear face of the display 100 and the end of the second casing 220 of the cover 200 may be attached to each other using the adhesive or the like, but this is not an essential process.

In an embodiment, as the plurality of printed circuit boards 300 are disposed to at least partially overlap each other, the relatively large printed circuit board 300 may be easily accommodated in the cover 200. Therefore, even when the total area of the plurality of printed circuit boards 300 exceeds the accommodation area of the cover 200, the printed circuit board 300 may be easily accommodated in the cover 200, thereby increasing the space efficiency of the cover 200.

Further, because the display apparatus has a structure free from the size of the printed circuit board 300, there is no need to reduce the size of the printed circuit board 300 excessively. In addition, the performance degradation of the display apparatus resulted from excessive omission of the elements and circuit structures in the process of reducing the size of the printed circuit board 300 may be suppressed.

In an embodiment, because the plurality of mounting grooves 411 defined in the first coupling protrusion are defined to be spaced apart from each other in the front and rear direction of the display apparatus, the printed circuit boards 300 mounted in the mounting grooves 411 are sufficiently spaced apart from each other, so that the damage and the performance degradation due to the interference or the contact between the boards may be suppressed.

The present disclosure as described above is not limited to the above-described embodiments and the accompanying drawings. It will be apparent to those of ordinary skill in the technical field to which the present disclosure belongs that various substitutions, modifications and changes may be made within the scope not departing from the technical ideas of the present disclosure. Therefore, the scope of the present disclosure is indicated by the following claims, and all changes or modifications derived from the meaning and scope of the claims and their equivalent concepts should be construed as being included in the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A device, comprising:
   a display apparatus, including:
      a display;
      a cover coupled to the display and providing therein a space;
      a plurality of printed circuit boards accommodated in the space; and
      a mounting plate coupled to the display and accommodated in the space, the mounting plate having a first mounting protrusion, wherein the plurality of printed circuit boards are mounted on the first mounting protrusion,
      wherein the first mounting protrusion includes a plurality of mounting grooves,
      wherein the plurality of printed circuit boards are mounted in the plurality of mounting grooves,
      wherein the plurality of mounting grooves are defined at positions spaced apart from each other in a length direction of the first mounting protrusion such that the plurality of the printed circuit boards mounted in the plurality of mounting grooves are spaced apart from each other,
   wherein the plurality of printed circuit boards includes:
      a first printed circuit board disposed toward a rear surface of the display;
      a second printed circuit board disposed toward a rear surface of the first printed circuit board; and
      a third printed circuit board disposed toward a rear surface of the second printed circuit board, wherein at least a portion of the first printed circuit board, the second printed circuit board and the third printed circuit board are disposed in the front and rear direction of the display apparatus,
   wherein the mounting plate further includes a second mounting protrusion extending in the front and rear direction of the display apparatus, wherein at least one of the second printed circuit board and the third printed circuit board is mounted on the second mounting protrusion, and
   wherein the plurality of mounting grooves are absent from the second mounting protrusion.

2. The device of claim 1, wherein the length direction of the first mounting protrusion is directed in a front and rear direction of the display apparatus.

3. The device of claim 2, wherein the plurality of mounting grooves are spaced apart from each other in the front and rear direction of the display apparatus.

4. The device of claim 3, wherein the first mounting protrusion has a fastening groove that is a recess extending into an end of the first mounting protrusion in the length direction of the first mounting protrusion, wherein the fastening groove of the first mounting protrusion is structured to receive a fastener.

5. The device of claim 4, wherein the cover includes:
   a first casing facing the mounting plate, a bottom face of the cover defined by the first casing; and
   a second casing bent from the first casing at edges of the first casing, wherein the second casing defines the space of the cover.

6. The device of claim 5, wherein the first casing has a coupling portion at a position corresponding to the fastening groove, the coupling portion structured to receive the fastener with the fastener extending through the coupling portion.

7. The device of claim 6, wherein the coupling portion of the first casing includes:
   a pressing portion recessed from a rear face of the first casing and protruding from a front face of the first casing, wherein the pressing portion is configured to press one face of at least one of the plurality of printed circuit boards; and
   a fastening hole extending through the pressing portion, wherein the fastening holes is structured to receive the fastener.

8. The device of claim 1, wherein the first mounting protrusion is one of a plurality of first mounting protrusions,
   wherein the plurality of first mounting protrusions are spaced apart from each other on the mounting plate in a direction intersecting the length direction of the first mounting protrusion.

9. The device of claim 1, wherein the first mounting protrusion includes:
   a first reduced diameter portion corresponding to a first one of the plurality of mounting grooves, wherein the first printed circuit board is seated in the first one of the plurality of mounting grooves;
   a second reduced diameter portion at a position spaced apart from the first reduced diameter portion in the length direction of the first mounting protrusion and corresponding to a second one of the plurality of mounting grooves, wherein the second printed circuit board is seated in the second one of the plurality of mounting grooves;
   a third reduced diameter portion at a position spaced apart from the second reduced portion in the length direction of the first mounting protrusion, wherein the third printed circuit board is seated in the third reduced diameter portion;
   a first large diameter portion disposed between the first reduced diameter portion and the second reduced diameter portion; and a second large diameter portion disposed between the second reduced diameter portion and the third reduced diameter portion.

10. The device of claim 9, wherein the first printed circuit board includes a recessed portion at an edge of the first printed circuit board, the recessed portion of the first printed circuit board mounted on the first reduced diameter portion of the first mounting protrusion.

11. The device of claim 9, wherein the second printed circuit board includes a recessed portion at an edge of the second printed circuit board, the recessed portion of the second printed circuit board mounted on the second reduced diameter portion of the first mounting protrusion.

12. The device of claim 9, wherein the third printed circuit board includes a first through hole extending through the third printed circuit board and seated on the third reduced diameter portion of the first mounting protrusion.

13. The device of claim 1, wherein the second mounting protrusion has a fastening groove that is a recess extending into an end of the second mounting protrusion in a length direction of the second mounting protrusion, wherein the fastening groove of the first mounting protrusion is structured to receive a fastener.

14. The device of claim 1, wherein the second mounting protrusion includes a first boss coupled to the second printed circuit board and a second boss coupled to the third printed circuit board, wherein the second boss has a length that is greater than a length of the first boss.

15. The device of claim 14, wherein the second printed circuit board has a first fastening hole at a position corresponding to the first boss, wherein the first fastening hole is structured to receive the fastener, and wherein the third printed circuit board has a second fastening hole at a position corresponding to the second boss, wherein the second fastening hole is structured to receive the fastener.

* * * * *